(12) United States Patent
Kim et al.

(10) Patent No.: US 8,163,463 B2
(45) Date of Patent: Apr. 24, 2012

(54) PHOTORESIST COMPOSITION, METHOD OF FORMING PATTERN USING THE PHOTORESIST COMPOSITION AND INKJET PRINT HEAD

(75) Inventors: Jin-baek Kim, Daejeon-si (KR); Byung-ha Park, Suwon-si (KR); Kyu-sik Kim, Yongin-si (KR); Young-ung Ha, Suwon-si (KR); Su-min Kim, Daejeon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 713 days.

(21) Appl. No.: 12/040,009

(22) Filed: Feb. 29, 2008

(65) Prior Publication Data

US 2009/0075197 A1 Mar. 19, 2009

(30) Foreign Application Priority Data

Aug. 7, 2007 (KR) .................. 10-2007-0079170

(51) Int. Cl.
*G03F 7/004* (2006.01)
*G03F 7/20* (2006.01)
*G03F 7/30* (2006.01)
*B41J 2/05* (2006.01)
*B41J 2/16* (2006.01)

(52) U.S. Cl. .................. 430/280.1; 430/270.1; 430/311; 430/319; 430/320; 430/325; 430/914; 430/921; 430/925; 430/9; 430/11; 430/14; 430/18; 347/20; 347/47; 347/56; 347/60; 347/61

(58) Field of Classification Search .......... None
See application file for complete search history.

(56) References Cited

U.S. PATENT DOCUMENTS

| 6,611,651 | B1 | 8/2003 | Ogawa et al. | |
|---|---|---|---|---|
| 7,524,610 | B2 * | 4/2009 | Kim et al. | 430/270.1 |
| 2006/0262157 | A1 | 11/2006 | Park et al. | |
| 2006/0264529 | A1 * | 11/2006 | Sasa | 522/170 |
| 2007/0060675 | A1 * | 3/2007 | Park et al. | 523/457 |
| 2008/0292986 | A1 * | 11/2008 | Park et al. | 430/270.1 |

FOREIGN PATENT DOCUMENTS

EP 0848294 6/1998

(Continued)

OTHER PUBLICATIONS

JPO English abstract for JP11-199647 (1999).*

(Continued)

*Primary Examiner* — Sin J. Lee
(74) *Attorney, Agent, or Firm* — Stanzione & Kim, LLP

(57) ABSTRACT

A photoresist composition including an oxetane-containing compound represented by Formula 1 or 2, an oxirane-containing compound represented by Formula 3 or 4, a photoinitiator, and a solvent, a method of forming a pattern using the photoresist composition, and an inkjet print head including a polymerization product of the photoresist composition.

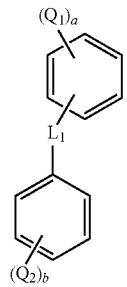

<Formula 1>

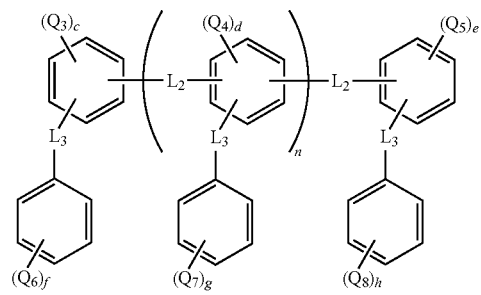

<Formula 2>

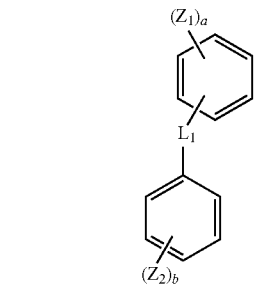

<Formula 3>

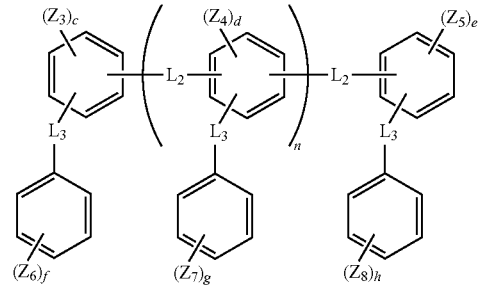

<Formula 4>

The photoresist composition provides a polymerization product which resists formation of cracks due to an inner stress, and has excellent heat tolerance, excellent chemical resistance, excellent adhesiveness, and excellent durability.

23 Claims, 5 Drawing Sheets

FOREIGN PATENT DOCUMENTS

| | | | |
|---|---|---|---|
| JP | 11-199647 | * | 7/1999 |
| JP | 2005114992 | | 4/2005 |
| JP | 2007-70320 | | 3/2007 |
| JP | 2007-70322 | | 3/2007 |
| WO | 02/21611 | | 3/2002 |

OTHER PUBLICATIONS

Machine-assisted English translation of JP11-199647 as provided by JPO (1999).*

Verstegen et al ("Synthesis and Photopolymerization of Oxetanes Derived from Bisphenol A", Journal of Applied Polymer Science, vol. 98, p. 1697-1707 (2005)).*

European Search Report issued Jul. 8, 2009 in EP Application No. 08154749.9.

Nuyken O et al., "Oxetane Photopolymerization—A System With Low Volume Shrinkage" Macromolecular Symposia, Wiley VCH Verlag, Weinheim, DE, vol. 107, Apr. 1, 1996, pp. 125-138, XP000625140 ISSN: 1022-1360.

Anonymous, "SU-8: Thick Photo-Resist for Mems" Free Mems Encyclopedia, [Online] 2007, XP002528126 Retrieved from the Internet: URL:http://memscyclopedia.org/su8.html> [retrieved on May 14, 2009].

Verstegen E J K et al: "Synthesis and Photopolymerization of Oxetanes Derived from Bisphenol A" Journal of Applied Polymer Science, John Wiley and Sons Inc. New York, US, vol. 98, Jan. 1, 2005, pp. 1697-1707, XP002473914 ISSN: 0021-8995.

European Examination Report issued in European Patent Application No. 08154749.9 on Dec. 12, 2011.

* cited by examiner

PHOTORESIST COMPOSITION, METHOD OF FORMING PATTERN USING THE PHOTORESIST COMPOSITION AND INKJET PRINT HEAD

CROSS-REFERENCE TO RELATED APPLICATIONS

This application claims priority under 35 U.S.C. §119(a) from Korean Patent Application No. 10-2007-0079170, filed on Aug. 7, 2007, in the Korean Intellectual Property Office, the disclosure of which is incorporated herein in its entirety by reference.

BACKGROUND OF THE INVENTION

1. Field of the Invention

The present general inventive concept relates to a photoresist composition, a method of forming a pattern using the photoresist composition, and an inkjet print head using the photoresist composition, and more particularly, to a photoresist composition providing a polymerization product which resists formation of cracks therein due to an inner stress in a pattern formed using a mixture of an oxetane-containing compound and an oxirane-containing compound, a method of forming a pattern using the photoresist composition, and an inkjet print head using the photoresist composition.

2. Description of the Related Art

Photolithography which is performed to form various kinds of patterns uses photoresists. A photoresist is a light-sensitive resin which has a varying solubility with respect to a developer when exposed to light so that an image corresponding to an exposure pattern can be obtained. Photoresists are categorized into a positive photoresist which is a type of photoresist in which a portion of the photoresist that is exposed to light becomes soluble to a developer and the exposed portion is removed in a developing process to obtain a desired pattern, and a negative photoresist which is a type of photoresist in which a portion of the photoresist that is exposed to light becomes substantially insoluble to a developer and the unexposed portion of the photoresist is removed in a developing process to obtain a desired pattern.

To obtain a structure having a predetermined pattern, the photoresist is coated on a substrate together with a solvent and then an exposure process and a developing process are performed thereon. For example, Korea Laid-open Publication No. 2004-0037858 discloses a method of forming a pattern using polycarbomethylsilane derivative for photoresist.

A pattern forming technique using photoresist can be applied in a wide range of applications in most technical fields, including inkjet print heads or micro electro mechanical systems (MEMS).

An inkjet printer is a device that forms an image of a predetermined color by ejecting small droplets from inkjet print head to a desired site of a to-be-printed medium. According to an ejection mechanism of ink droplet, inkjet print heads can be categorized into a thermal operation-type inkjet print head that uses a thermal source to generate bubbles of ink and ejects ink droplet by an expansion force of the generated bubbles, and a piezo-electric operation-type inkjet print head that uses a piezo-electric material and ejects ink droplet by a pressure that is applied to ink due to deformation of the piezo-electric material used. Inkjet print heads include a chamber layer and/or a nozzle layer, and the chamber and nozzle layers should be formed in such a way that ink is easily ejected and the chamber and nozzle layers are effectively adhered to a substrate supporting the chamber and nozzle layers. Furthermore, the chamber layer and/or nozzle layer of the thermal operation-type inkjet print heads requires excellent heat tolerance.

Meanwhile, a MEMS switch, which is the most common type of radio frequency (RF) devices using a MEMS technology, requires various sacrificial layers having predetermined patterns in the fabrication process.

There is a need to develop a photoresist composition suitable for a fabrication process of inkjet print head or a MEMS switch photoresist composition.

Conventionally, an epoxy resin is used in a process of fabricating inkjet print head or MEMS switch. The epoxy resin possesses excellent mechanical properties but its polymerization product cracks when exposed to an inner stress.

Therefore, to prevent formation of cracks, there is a need to develop a novel photoresist composition which can hinder formation of cracks due to an inner stress.

SUMMARY OF THE INVENTION

The present general inventive concept provides a photoresist composition providing a polymerization product which has excellent heat tolerance, excellent chemical resistance, and excellent adhesiveness and resists formation of cracks in the polymerization product due to an inner stress, a method of forming a pattern using the photoresist composition, and an inkjet print head including a polymerization product of the photoresist composition.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a photoresist composition including an oxetane-containing compound represented by Formula 1 or Formula 2, an oxirane-containing compound represented by Formula 3 or Formula 4, a photoinitiator, and a solvent Formula 1

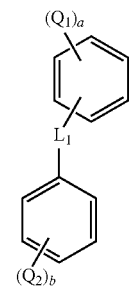

Formula 2

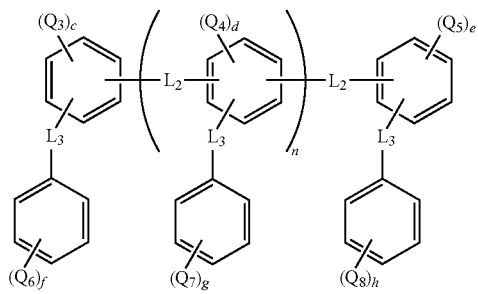

Formula 3

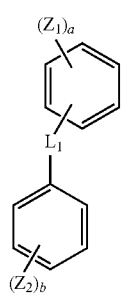

Formula 4

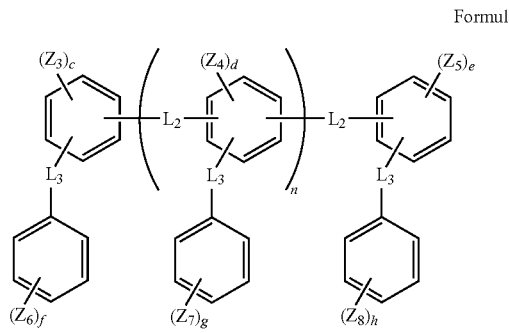

where $Q_1$, $Q_2$, $Q_3$, $Q_4$, $Q_5$, $Q_6$, $Q_7$, and $Q_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_4$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted C6-C30 acyl group, or a substituted or unsubstituted ether bond-containing monovalent group, in which a plurality of $Q_1$, $Q_2$, $Q_3$, $Q_4$, $Q_5$, $Q_6$, $Q_7$, and $Q_8$ can be different from or identical to each other, and at least one hydrogen atom of a plurality of $Q_1$ and $Q_2$ and at least one hydrogen atom of a plurality of $Q_3$, $Q_4$, $Q_5$, $Q_6$, $Q_7$, and $Q_8$ are substituted with an oxetane group, $Z_1$, $Z_2$, $Z_3$, $Z_4$, $Z_5$, $Z_6$, $Z_7$, and $Z_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Z_1$, $Z_2$, $Z_3$, $Z_4$, $Z_5$, $Z_6$, $Z_7$, and $Z_8$ can be different from or identical to each other, and at least one hydrogen atom of a plurality of $Z_1$, and $Z_2$ and at least one hydrogen atom of a plurality of $Z_3$, $Z_4$, $Z_5$, $Z_6$, $Z_7$, and $Z_8$ can be substituted with an oxirane group, a plurality of a, b, c, d, e, f, g, and h represent a number of $Z_1$, $Z_2$, $Z_3$, $Z_4$, $Z_5$, $Z_6$, $Z_7$, and $Z_8$, respectively, a is 1, 2, 3, or 4, b is 1, 2, 3, 4, or 5, c and e are each independently 1, 2, or 3, d is 1 or 2, f, g, and h are each independently 1, 2, 3, or 4, $L_1$, $L_2$, and $L_3$ are each independently, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_6$-$C_{30}$ arylene group, a substituted or unsubstituted $C_3$-$C_{30}$ hetero arylene group, or a substituted or unsubstituted ether bond-containing divalent group where n is 0 or an integer ranging from 1 to 10, and a, b, c, d, e, f, g, h, $L_1$, $L_2$, $L_3$, and n can be different from or identical to each other.

The foregoing and/or other aspects and utilities of the present general inventive concept may also be achieved by providing a method of forming a pattern including coating the photoresist composition described above on a substrate, and exposing the coated photoresist composition according to the pattern and then developing the exposed product to obtain a structure having the pattern.

The foregoing and/or other aspects and utilities of the present general inventive concept may also be achieved by providing an inkjet print head including a polymerization product of an oxetane-containing compound and an oxirane-containing compound which are included in the photoresist composition described above.

The foregoing and/or other aspects and utilities of the present general inventive concept may also be achieved by providing a photoresist composition, including an oxetane-containing compound comprising a plurality of hydrocarbons and at least one oxetane group, an oxirane-containing compound comprising a plurality of hydrocarbons and at least one oxirane group, and a photoinitiator to initiate polymerization of the oxetane-containing compound when the photoresist composition is exposed to light.

The oxetane-containing compound may further include a hydroxyl group, and the oxirane-containing compound may further include a hydroxyl group.

The foregoing and/or other aspects and utilities of the present general inventive concept may also be achieved by providing an inkjet print head, including a chamber layer to store ink, and a nozzle layer through which the ink is ejected, wherein at least one of the chamber layer and the nozzle layer are formed using a photoresist composition, including an oxetane-containing compound comprising a plurality of hydrocarbons and at least one oxetane group, an oxirane-containing compound comprising a plurality of hydrocarbons and at least one oxirane group, and a photoinitiator to initiate polymerization of the oxetane-containing compound when the photoresist composition is exposed to light.

The inkjet print head may further include a substrate layer including an ink feed hole to supply ink to the chamber layer.

The chamber layer may include a plurality of ink chambers to store the ink, and a plurality of restrictors to connect the plurality of ink chambers to the ink feed hole.

The inkjet print head may further include a plurality of heaters to heat the ink, and an insulating layer formed on the substrate layer to insulate the plurality of heaters from the substrate layer.

The oxetane-containing compound further includes a hydroxyl group, and the oxirane-containing compound further includes a hydroxyl group.

The foregoing and/or other aspects and utilities of the present general inventive concept may also be achieved by providing a method of forming a pattern, the method including coating a photoresist composition on a substrate, the photoresist composition comprising an oxetane-containing compound comprising a plurality of hydrocarbons and at least one oxetane group, an oxirane-containing compound comprising a plurality of hydrocarbons and at least one oxirane group, and a photoinitiator to initiate polymerization of the oxetane-containing compound when the photoresist composition is exposed to light, exposing the coated photoresist composition to light according to the pattern, and developing the exposed product to obtain a structure having the pattern.

The structure may be a layer of an inkjet print head or a sacrificial layer to fabricate a micro-electro mechanical system (MEMS) switch.

BRIEF DESCRIPTION OF THE DRAWINGS

The above and other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
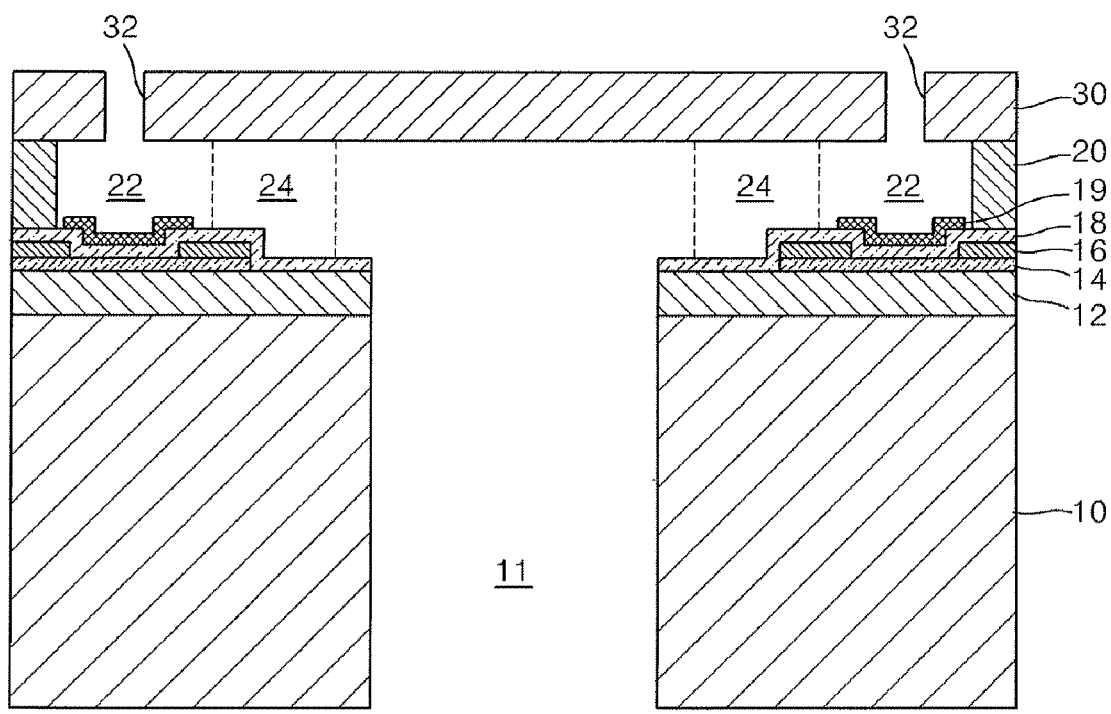
FIG. 1 is a sectional view of inkjet print head according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

A photoresist composition according to the present general inventive concept includes an oxetane-containing compound represented by Formula 1 or 2, an oxirane-containing compound represented by Formula 3 or 4, a photoinitiator, and a solvent.

The oxetane-containing compound included in the photoresist composition according to the present general inventive concept includes at least one oxetane ring. The oxetane ring is a 4-membered ring having an oxygen atom. In general, a compound containing the oxetane ring possesses excellent polymerization properties. The oxirane-containing compound included in the photoresist composition according to the present general inventive concept includes at least one oxirane ring. For example, the oxirane-containing compound can be an epoxy resin having an oxirane ring. The oxirane ring is a 3-membered ring including an oxygen atom. In general, a compound containing the oxirane ring possesses excellent polymerization properties. The oxetane-containing compound reacts relatively slower than the oxirane-containing compound and a decreased crosslinking speed may be experienced. Such a slow reaction speed may contribute to a decrease in cracks formed in a hardened product after the reaction.

The oxetane-containing compound included in the photoresist composition according to the present general inventive concept can be represented by Formula 1 or 2:

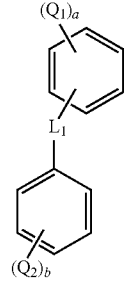

Formula 1

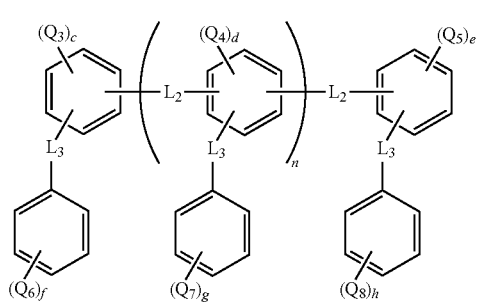

Formula 2 where $Q_1$, $Q_2$, $Q_3$, $Q_4$, $Q_5$, $Q_6$, $Q_7$, and $Q_8$ are each independently a hydrogen hydroxyl group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_4$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group.

At least one hydrogen atom of a plurality of $Q_1$ and $Q_2$ and at least one hydrogen atom of a plurality of $Q_3$, $Q_4$, $Q_5$, $Q_6$, $Q_7$, and $Q_8$ must be substituted with an oxetane group. Specifically, the oxetane group can be represented by Formula 5:

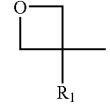

Formula 5 where, $R_1$ can be selected from the group consisting of hydrogen, halogen atom, hydroxy group, nitro group, cyano group, amino group, amidino group, a hydrazine group, a hydrazone group, a carboxyl group, salt of the carboxyl group, a sulfuric acid group, salt of the sulfuric acid group, phosphoric acid, salt of the phosphoric acid, a carbonyl group, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_6$-$C_{30}$ aryl group, and a substituted or unsubstituted $C_2$-$C_{20}$ hetero aryl group.

Specifically, in Formula 5, $R_1$ can be hydrogen, or a substituted or unsubstituted $C_1$-$C_{10}$ alkyl group.

Therefore, the oxetane group-containing compound included in the photoresist composition according to the present general inventive concept must be substituted with at least one oxetane group.

Specifically, $Q_1$, $Q_2$, $Q_3$, $Q_4$, $Q_5$, $Q_6$, $Q_7$, and $Q_8$ are each independently hydrogen, a hydroxyl group, a $C_1$-$C_{30}$ alkoxy group substituted with an oxetane group represented by Formula 5 or a carbonyl group, a $C_1$-$C_{30}$ alkyl group substituted with an oxetane group represented by Formula 5 or a carbonyl group, or an ether bond-containing group substituted with an oxetane group represented by Formula 5 or a carbonyl group. More specifically, $Q_1$, $Q_2$, $Q_3$, $Q_4$, $Q_5$, $Q_6$, $Q_7$, and $Q_8$ are each independently hydrogen, a hydroxyl group, a $C_1$-$C_{10}$ alkoxy group substituted with an oxetane group represented by Formula 5 or a carbonyl group, a $C_1$-$C_{10}$ alkyl group substituted with an oxetane group represented by Formula 5 or a carbonyl group, or an ether bond-containing group substituted with an oxetane group represented by Formula 5 or a carbonyl group. At least one hydrogen atom of $Q_1$ and $Q_2$ and at least one hydrogen atom of $Q_3$, $Q_4$, $Q_5$, $Q_6$, $Q_7$ and $Q_8$ must be substituted with the oxetane group.

More specifically, $Q_1$, $Q_2$, $Q_3$, $Q_4$, $Q_5$, $Q_6$, $Q_7$, and $Q_8$ are each independently hydrogen, or a group selected from the groups represented by Formula 6:

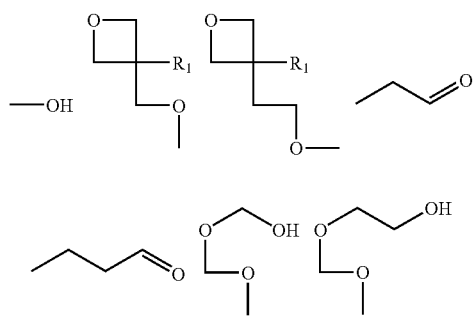

Formula 6

In Formula 1 or 2, a, b, c, d, e, f, g, and h represent how many groups each exist of $Q_1$, $Q_2$, $Q_3$, $Q_4$, $Q_5$, $Q_6$, $Q_7$, and $Q_8$, respectively. That is, each of $Q_1$, $Q_2$, $Q_3$, $Q_4$, $Q_5$, $Q_6$, $Q_7$, and $Q_8$ can exist in plurality. Also, a plurality of $Q_1$, $Q_2$, $Q_3$, $Q_4$, $Q_5$, $Q_6$, $Q_7$, and $Q_8$ can be identical to or different from each other. For example, when a is 2, there can be two $Q_1$s in which two $Q_1$s can be identical to or different from each other.

In Formulae 1 and 2, a can be 1, 2, 3, or 4, b can be 1, 2, 3, 4, or 5, c and e can be each independently 1, 2, or 3, and d can be 1 or 2, and f, g, and h can be each independently 1, 2, 3, or 4.

The oxirane-containing compound included in the photoresist composition according to the present general inventive concept can be represented by Formula 3 or 4.

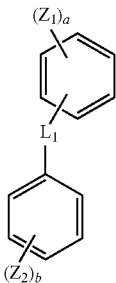

Formula 3

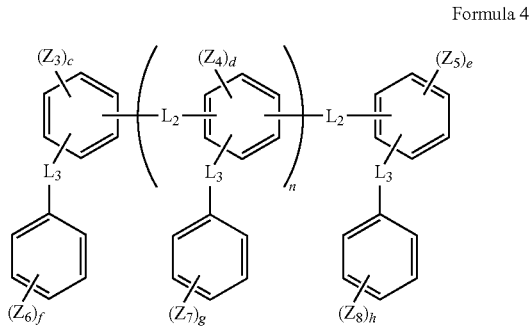

Formula 4 where $Z_1$, $Z_2$, $Z_3$, $Z_4$, $Z_5$, $Z_6$, $Z_7$, and $Z_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group.

A plurality of $Z_1$, $Z_2$, $Z_3$, $Z_4$, $Z_5$, $Z_6$, $Z_7$, and $Z_8$ can be different from or identical to each other, and at least one hydrogen atom of a plurality of $Z_1$, and $Z_2$ and at least one hydrogen atom of a plurality of $Z_3$, $Z_4$, $Z_5$, $Z_6$, $Z_7$, and $Z_8$ are necessarily substituted with an oxirane group. Specifically, the oxirane group can be represented by Formula 7:

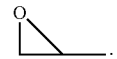

Formula 7

Therefore, the oxirane group-containing compound included in photoresist composition according to the present general inventive concept necessarily includes at least one oxirane group.

Specifically, $Z_1$, $Z_2$, $Z_3$, $Z_4$, $Z_5$, $Z_6$, $Z_7$, and $Z_8$ are each independently hydrogen, a hydroxyl group, a $C_1$-$C_{30}$ alkoxy group substituted with the oxirane group represented by Formula 7 or a carbonyl group, a $C_1$-$C_{30}$ alkyl group substituted with the oxirane group represented by Formula 7 or a carbonyl group, or an ether bond-containing group substituted with the oxirane group represented by Formula 7 or a carbonyl group. More Specifically, $Z_1$, $Z_2$, $Z_3$, $Z_4$, $Z_5$, $Z_6$, $Z_7$, and $Z_8$ are each independently hydrogen, a hydroxyl group, a $C_1$-$C_{10}$ alkoxy group substituted with the oxirane group represented by Formula 7 or a carbonyl group, a $C_1$-$C_{10}$ alkyl group substituted with the oxirane group represented by Formula 7 or a carbonyl group, or an ether bond-containing group substituted with the oxirane group represented by Formula 7 or a carbonyl group. At least one hydrogen atom of $Z_1$ and $Z_2$ and at least one hydrogen atom of $Z_3$, $Z_4$, $Z_5$, $Z_6$, $Z_7$, and $Z_8$ must be substituted with the oxirane group.

More specifically, $Z_1$, $Z_2$, $Z_3$, $Z_4$, $Z_5$, $Z_6$, $Z_7$, and $Z_8$ are each independently hydrogen, and a group selected from the groups represented by Formula 8.

Formula 8

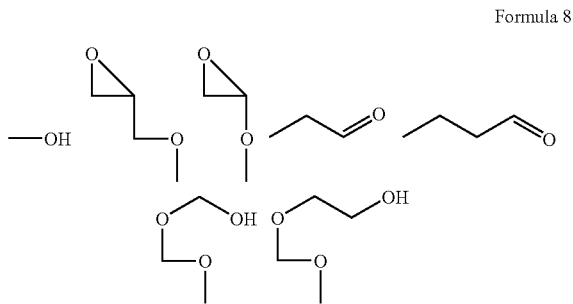

In Formulae 3 and 4, a, b, c, d, e, f, g, and h represent how many groups each exist of $Z_1$, $Z_2$, $Z_3$, $Z_4$, $Z_5$, $Z_6$, $Z_7$, and $Z_8$, respectively. At this time, a plurality of $Z_1$, $Z_2$, $Z_3$, $Z_4$, $Z_5$, $Z_6$, $Z_7$ and $Z_8$ can be identical to or different from each other. For example, when a is 2, there can be two $Z_1$s, in which two $Z_1$s can be identical to or different from each other.

In Formulae 3 and 4, a can be 1, 2, 3, or 4, b can be 1, 2, 3, 4, or 5, c and e can be each independently 1, 2, or 3, d can be 1 or 2; and f, g, and h can be each independently 1, 2, 3, or 4.

In Formulae 1 through 4, a plurality of a, b, c, d, e, f, g, h, $L_1$, $L_2$, $L_3$, and n can be identical to or different from each other. For example, a of Formula 1 or 2 can differ from a of Formula 3 or 4.

In Formulae 1 through 8 according to an embodiment of the present general inventive concept, the unsubstituted $C_1$-$C_{30}$ alkyl group can be methyl, ethyl, propyl, isobutyl, sec-butyl, pentyl, iso-amyl, or hexyl, and at least one hydrogen atom of the alkyl group can be substituted with an oxetane group, an oxirane group, halogen atom, a hydroxy group, a nitro group, a cyano group, an amino group, an amidino group, hydrazine, hydrazone, a carboxyl group, a salt of the carboxyl group, a sulfuric acid group, a salt of the sulfuric acid group, phosphoric acid, a salt of the phosphoric acid, a carbonyl group, a $C_1$-$C_{30}$ alkyl group, a $C_1$-$C_{30}$ alkenyl group, a $C_1$-$C_{30}$ alkynyl group, a $C_6$-$C_{30}$ aryl group, a $C_7$-$C_{20}$ aryl alkyl group, a $C_2$-$C_{20}$ hetero aryl group, a $C_3$-$C_{30}$ hetero aryl alkyl group, a $C_6$-$C_{30}$ aryloxy group, or a group represented by —N($Y_1$) ($Y_2$) where $Y_1$ and $Y_2$ can each independently be selected from the group consisting of hydrogen, a substituted or unsubstituted $C_1$-$C_{30}$ alkyl group, a substituted or unsubstituted $C_1$-$C_{30}$ halo alkyl group, a substituted or unsubstituted $C_6$-$C_{30}$ aryl group, a substituted or unsubstituted $C_6$-$C_{30}$ halo aryl group, and a substituted or unsubstituted $C_2$-$C_{30}$ hetero aryl group. In Formulae according to the present general inventive concept, the unsubstituted $C_2$-$C_{30}$ alkenyl group has such a structure that the alkyl group described above has a double bond at its middle or ends thereof. Specifically, the unsubstituted $C_2$-$C_{30}$ alkenyl group can be ethylene, propylene, butylene, or hexylene. In the alkenyl groups described above, at least one hydrogen atom can be substituted with such substituents as having been described with reference to the alkyl group.

In Formulae according to the present general inventive concept, the unsubstituted $C_2$-$C_{30}$ alkynyl group has such a structure that the alkyl group described above has a triple bond at its middle or ends thereof. Specifically, the unsubstituted $C_2$-$C_{30}$ alkynyl group can be acetylene, propylene, phenylacetylene, naphthylacetylene, isopropylacetylene, t-butylacetylene, or diphenylacetylene. In the alkynyl group, at least one hydrogen atom can be substituted with such substituents as having been described with reference to the alkyl group.

In Formulae 1 through 8 according to an embodiment of the present general inventive concept, the unsubstituted $C_1$-$C_{30}$ alkoxy group is represented by —$OA_1$ where $A_1$ denotes the alkyl group described above. The alkoxy group can be methoxy, ethoxy, phenyloxy, cyclohexyloxy, naphthyloxy, isopropyloxy, or diphenyloxy. In the alkoxy group described above, at least one hydrogen atom can be substituted with such substituents as having been described with reference to the alkyl group.

In Formulae 1 through 8 according to an embodiment of the present general inventive concept, the unsubstituted $C_4$-$C_{30}$ aliphatic hydrocarbon ring can be a cyclohexyl group or a cycloheptyl group, but is not limited thereto. In the aliphatic hydrocarbon ring, at least one hydrogen atom can be substituted with such substituents as having been described with reference to the alkyl group. In the aliphatic hydrocarbon ring, a carbon atom can be substituted with, for example,

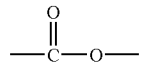

to form a ring-type ester, that is, lactone.

In Formulae 1 through 8 according to an embodiment of the present general inventive concept, unsubstituted $C_6$-$C_{30}$ aryl group refers to a carbocyclic aromatic system having 6-30 carbon atoms including at least one aromatic ring, in which at least one ring can be fused together or connected to each other there a single bond. In the aryl group, at least one hydrogen atom can be substituted with such substituents as having been described with reference to the alkyl group.

Further, in Formulae 1 through 8 according to an embodiment of the present general inventive concept, the substituted or unsubstituted $C_6$-$C_{30}$ aryl group can be a phenyl group, a $C_1$-$C_{10}$ alkylphenyl group (for example, ethylphenyl group), a halophenyl group (for example, o-, m-, and p-fluorophenyl group, dichlorophenyl group), a cyanophenyl group, dicyanophenyl group, a trifluoromethoxyphenyl group, biphenyl group, a halobiphenyl group, a cyanobiphenyl group, a $C_1$-$C_{10}$alkyl biphenyl group, a $C_1$-$C_{10}$ alkoxybiphenyl group, a o-, m-, and p-toryl group, a o-, m-, and p-cumenyl group, a mesityl group, phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group(for example, fluoronaphthyl group), a $C_1$-$C_{10}$ alkylnaphthyl group(for example, methylnaphthyl group), a $C_1$-$C_{10}$ alkoxynaphthyl group(for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, or an ovalenyl group.

In Formulae 1 through 8 according to an embodiment of the present general inventive concept, the unsubstituted $C_3$-$C_{30}$ hetero aryl group refers to an one or more aromatic ring system that has at least one heteroatom selected form N, O, P, and S and the other ring atoms are carbon atoms (C), in which the at least one aromatic rings are fused together or can be connected to each other through a single bond. In the hetero aryl group, at least one hydrogen atom can be substituted with such substituents as having been described with reference to the alkyl group.

In Formulae 1 through 8 according to an embodiment of the present general inventive concept, the unsubstituted $C_3$-$C_{30}$ hetero aryl group can be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, or an isoquinolinyl group.

In Formulae 1 through 8 according to an embodiment of the present general inventive concept, the unsubstituted $C_6$-$C_{30}$ aryloxy group is a group represented by —$OA_2$ where $A_2$ denotes the aryl group described above. The unsubstituted $C_6$-$C_{30}$ aryloxy group can be a penoxy group. In the aryloxy group, at least one hydrogen atom can be substituted with such substituents as having been described with reference to the alkyl group.

In Formulae 1 through 8 according to an embodiment of the present general inventive concept, the unsubstituted $C_6$-$C_{30}$ acyl group is a group represented by —$COA_3$ where $A_3$ can be the alkyl group or aryl group described above. The unsubstituted $C_6$-$C_{30}$ acyl group can be an acetyl group(—$COCH_3$) or a benzoyl group(—$COC_6H_5$). In the acyl group, at least one hydrogen atom can be substituted with such substituents as having been described with reference to the alkyl group.

In Formulae 1 through 8 according to an embodiment of the present general inventive concept, the unsubstituted ether bond-containing monovalent group has such a structure that at least one carbon of the alkyl group, alkenyl group, alkynyl group, or alkoxy group described above is substituted with —$C(A_4)(A_5)$—O— where $A_4$ and $A_5$ can be each independently a bond, a hydrogen, or the alkyl group. In the ether bond-containing monovalent group, at least one hydrogen atom can be substituted with such substituents as having been described with reference to the alkyl group.

In Formulae 1 through 4, $L_1$, $L_2$, and $L_3$ are each independently, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_6$-$C_{30}$ arylene group, a substituted or unsubstituted $C_3$-$C_{30}$ hetero arylene group, or a substituted or unsubstituted ether bond-containing divalent group.

In Formulae 1 through 8 according to an embodiment of the present general inventive concept, the unsubstituted $C_1$-$C_{30}$ alkylene group is a divalent connecting group having a structure similar to that of the alkyl group. The unsubstituted $C_1$-$C_{30}$ alkylene group can be a methylene group or an ethylene group. In the alkylene groups, at least one hydrogen atom can be substituted with such substituents as having been described with reference to the alkyl group.

In Formulae 1 through 8 according to an embodiment of the present general inventive concept, the unsubstituted $C_2$-$C_{30}$ alkenylene group, the unsubstituted $C_2$-$C_{30}$ alkynylene group, the unsubstituted $C_6$-$C_{30}$ arylene group, the unsubstituted $C_3$-$C_{30}$ hetero arylene group, the unsubstituted ether bond-containing divalent group are divalent connecting groups having structures similar to that of the alkenyl group described above, that of the alkynyl group described above, that of the aryl group described above, that of the hetero aryl group described above, and that of the ether bond-containing monovalent group described above, respectively. In the substituted $C_2$-$C_{30}$ alkenylene group, the substituted $C_6$-$C_{30}$ arylene group, the substituted $C_3$-$C_{30}$ hetero arylene group, and the substituted ether bond-containing divalent group, at least one hydrogen atom can be substituted with such substituents as having been described with reference to the alkyl group.

Specifically, $L_1$, $L_2$, and $L_3$ have each independently a structure selected from the structures represented by Formula 9.

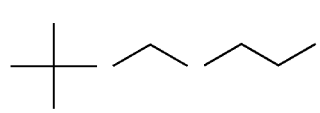

Formula 9

In Formulae 1 through 4, n is 0 or an integer ranging from 1 to 10, specifically, 0, or an integer ranging from 1 to 5.

The oxetane-containing compound included in the photoresist composition according to an embodiment of the present general inventive concept can be, for example, represented by Formula 10 or Formula 11.

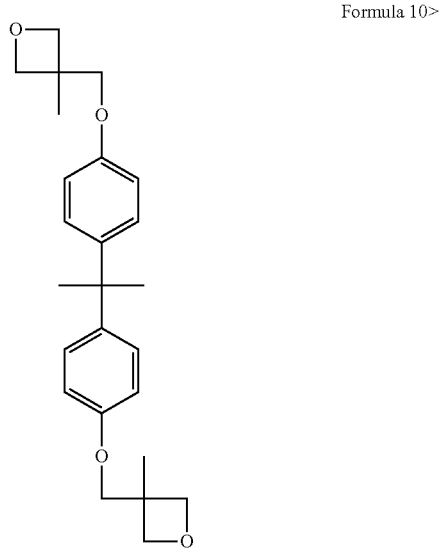

Formula 10>

Formula 11

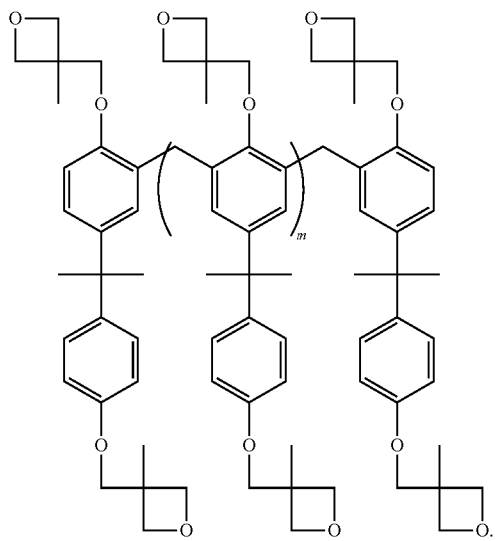

In Formula 11, m may be 0, 1, or 2.

Formula 10 illustrates two oxetane groups. However, according to synthesis conditions, at least one methoxy group substituted with an oxetane group can be another substituent, for example, a hydroxyl group. Formula 11 illustrates 4-8 oxetane groups according to m. However, according to synthesis conditions, at least one methoxy group substituted with an oxetane group can be other substituent, for example, a hydroxyl group. Such a technical feature would be obvious to one of ordinary skill in the art in view of a process of synthesizing an oxetane group-containing compound which will be described in detail.

The oxirane group-containing compound included in the photoresist composition according to an embodiment of the present general inventive concept can be represented by Formula 12 or Formula 13.

Formula 12

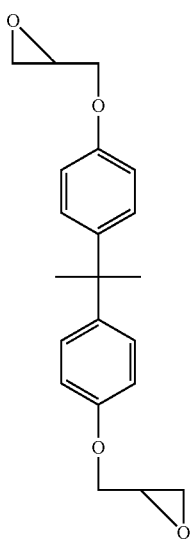

Formula 13

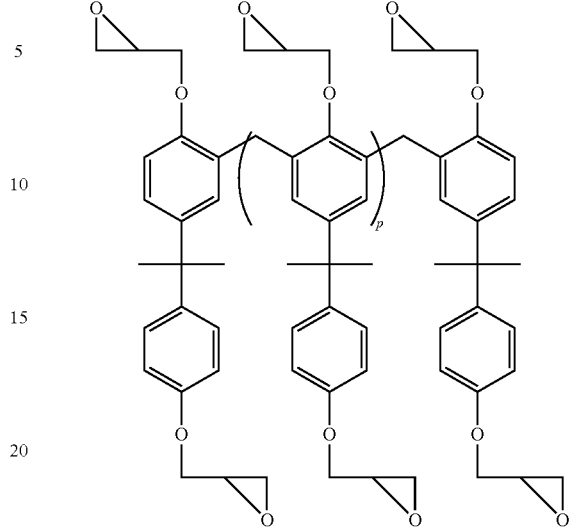

In Formula 13, p may be 0, 1, or 2.

Formula 12 illustrates two oxirane groups. However, according to synthesis conditions, at least one methoxy group substituted with an oxirane group can be another substituent, for example, a hydroxyl group. Formula 13 illustrates 4-8 oxetane groups according to p. However, according to synthesis conditions, at least one methoxy group substituted with an oxirane group can be another substituent, for example, a hydroxyl group. Such a technical feature is the same as having been described with reference to the oxetane group.

The oxetane-containing compound represented by Formula 1 or 2 can be synthesized using various methods. For example, an oxetane-containing sulfuric acid ester or an oxetane-containing halogenated alkane is reacted with a benzene ring-containing compound to obtain an oxetane-containing compound represented by Formula 1 or 2.

The oxetane-containing sulfuric acid ester can be obtained by reacting oxetane-containing alcohol with a halide having —(O=S=O)—. The oxetane-containing halogenated alkane can be obtained by halogenating oxetane-containing alcohol or the oxetane-containing sulfuric acid ester, for example, by using $CBr_4$ or NaBr. The oxetane-containing sulfuric acid ester remains in a solid phase and the oxetane-containing halogenated alkane remains in a liquid phase, after the synthesis reaction of the oxetane-containing compound is complete. Therefore, the oxetane-containing halogenated alkane may not act as an impurity with respect to the generated oxetane-containing compound. The oxetane-containing sulfuric acid ester can be, for example, toluene-4-sulfuric acid 3-methyl-oxetane-3-yl methyl ester, and the oxetane-containing halogenated alkane can be, for example, 3-methyl-3-(bromomethyl)oxetane.

In the synthesis process, at least some of the oxetane-containing sulfuric acid ester or oxetane-containing halogenated alkane may not react with the benzene ring-containing compound. Therefore, the oxetane-containing compound according to an embodiment of the present general inventive concept can include other groups, in addition to the oxetane group, as defined with reference to Formula 1 or 2. These are the same as the oxirane-containing compound.

The benzene ring-containing compound can be any benzene ring-containing compound that is used to synthesize an oxetane-containing compound represented by Formula 1 or 2 and is known in the art. For example, the benzene ring-containing compound can be a commercially available novolac resin. Specifically, the novolac resin can be bispenol A, but is not limited thereto.

The oxetane-containing compound represented by Formula 1 or 2 and the oxirane-containing compound represented by Formula 3 or 4 can start to polymerize when exposed to light irradiation. Therefore, the oxetane-containing compound represented by Formula 1 or 2 and the oxirane-containing compound represented by Formula 3 or 4 can act as a photoresist in the photoresist composition according to the present general inventive concept.

In the photoresist composition including the oxetane-containing compound and the oxirane-containing compound, the weight ratio of the oxirane-containing compound with respect to the oxetane-containing compound may be in the range from 1:0.1 to 1:10, but is not limited thereto.

The photoinitiator included in the photoresist composition according to the present general inventive concept may initiate polymerization of the oxetane-containing compound when the photoresist composition is exposed to light.

The photoinitiator can be, for example, onium salt of Group 15 element, onium salt of Group 16 element, such as sulfonium salt, aromatic halonium salt, such as aromatic iodonium salt, or a mixture thereof.

Specifically, the sulfonium salt can be triphenylsulfonium tetrafluoroborate, methyldiphenylsulfonium tetrafluoroborate, dimethyldiphenylsulfonium hexafluorophosphate, triphenylsulfonium hexafluorophosphate, triphenylsulfonium hexafluoroantimonate, dipenylnaphthylsulfonium hexafluoroarsenate, tritolysulfonium hexafluorophosphate, anisyldiphenylsulfonium hexafluoroantimonate, 4-butoxyphenyldiphenylsulfonium tetrafluoroborate, 4-chlorophenyldiphenylsulfonium hexafluoroantimonate, tris(4-penoxyphenyl)sulfonium hexafluorophosphate, di(4-ethoxyphenyl)methylsulfonium hexafluoroarcenate, 4-acetoxy-phenyldiphenylsulfonium tetrafluoroborate, tris(4-thiomethoxyphenyl)sulfonium hexafluorophosphate, di(methoxysulfonylphenyl)methylsulfonium hexafluoroantimonate, di(methoxynaphthyl)methylsulfonium tetrafluoroborate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenylsulfonium tetrafluoroborate, methyl(n-methylphenothiazinyl)sulfonium hexafluoroantimonate, phenylmethylbenzylsulfonium hexafluorophosphate, or derivatives thereof, but is not limited thereto.

The aromatic iodonium salt can be diphenyliodonium tetrafluoroborate, di(4-methylphenyl)iodonium tetrafluoroborate, phenyl-4-methylphenyliodonium tetrafluoroborate, di(4-heptylphenyl)iodonium tetrafluoroborate, di(3-nitrophenyl)iodonium hexafluorophosphate, di(4-chlorophenyl)iodonium hexafluorophosphate, di(naphthyl)iodonium tetrafluoroborate, diphenyliodonium hexafluorophosphate, di(4-methylphenyl)iodonium hexafluorophosphate, diphenyliodonium hexafluoroarcenate, di(4-penoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulfonylphenyl)iodonium hexafluorophosphate, di(4-acetamidophenyl)iodonium hexafluorophosphate, di(2-benzoethienyl)iodonium hexafluorophosphate, or derivatives thereof, but is not limited thereto.

The amount of the photoinitiator may be in a range from 5 parts by weight to 20 parts by weight, specifically 8 parts by weight to 16 parts by weight, based on 200 parts by weight of the mixture of the oxetane-containing compound and oxirane-containing compound. When the amount of the photoinitiator is less than 5 parts by weight based on 200 parts by weight of the mixture of the oxetane-containing compound and oxirane-containing compound, when the photoresist composition is exposed to light, the oxetane-containing compound may be ineffectively polymerized. In contrast, when the amount of the photoinitiator is greater than 20 parts by weight based on 200 parts by weight of the mixture of the oxetane-containing compound and oxirane-containing compound, a pattern size can be increased rather than an actual mask size through acid diffusion, which is called as a linewidth variations phenomenon, and also, the shape of a pattern can be changed due to neutralization caused by an acid, which is known as a T-top and Foot phenomenon.

The solvent can be γ-butyrolactone, cyclopentanone, $C_1$-$C_6$ acetate, tetrahydrofuran, xylene, or a mixture thereof, but is not limited thereto.

The amount of the solvent present in the photoresist composition according to an embodiment of the present general inventive concept may be in a range from 30 parts by weight to 100 parts by weight, specifically 30 parts by weight to 80 parts by weight, based on 200 parts by weight of the mixture of the oxetane-containing compound and oxirane-containing compound. When the amount of the solvent is less than 30 parts by weight based on 200 parts by weight of the mixture of the oxetane-containing compound and oxirane-containing compound, printability of the photoresist composition may be degraded. In contrast, when an amount of the solvent is greater than 100 parts by weight based on 200 parts by weight of the mixture of the oxetane-containing compound and oxirane-containing compound, the amount of the solid content may be relatively decreased, and thus, viscosity of the photoresist composition can be decreased so that it is difficult to control the thickness of a layer in a coating process.

The photoresist composition according to an embodiment of the present general inventive concept may further include, in addition to the oxetane-containing compound, the oxirane-containing compound, the photoinitiator, and the solvent, additives, such as a silane coupling agent, a dye, or a surfactant. Furthermore, the photoresist composition can include a filler, such as barium sulphate, talc, glass bubbles, or a viscosity reformer, such as silica. Also, the photoresist composition can further include any additive that is known in the art and can improve properties of the photoresist composition. Use of additives described above would be obvious to one of ordinary skill in the art.

The photoresist composition described above can be used in forming various kinds of patterns. Specifically, a method of forming a pattern using the photoresist composition includes coating the photoresist composition on a substrate, exposing the coated photoresist composition according to a predetermined pattern and then developing the exposed photoresist composition to obtain a structure having a pattern.

The photoresist composition can be coated using a conventional printing method, such as a spin coating method, a dipping method, or inkjet printing method.

The exposing process may use a photomask to perform an exposing process utilizing a particular pattern. Before and/or after the exposing process, selectively, a heat treatment may be performed on the coated photoresist composition. When the heating process is performed before the exposing process, the solvent included in the coating layer can be removed and thus a planar layer can be obtained. Alternatively, when the heating process is performed after the exposing process, Tg of a polymer in the coating layer can be increased so that an acid generated by light can be effectively diffused to a bottom of the substrate. In addition, by the heating treatment, a crosslinking polymerization reaction can be facilitated.

In the exposing process, the mixture of the oxetane-containing compound and the oxirane-containing compound in an exposure portion of the photoresist composition initiates its polymerization by a photoinitiator to form a polymer. Therefore, the mixture of the oxetane-containing compound and the oxirane-containing compound in the exposure portion of the photoresist composition is not dissolved by a developer. Thus, a structure having a polymerization product of the mixture of the oxetane-containing compound represented by Formula 1 or 2, and the oxirane-containing compound represented by Formula 3 or 4 and the pattern that corresponds to the exposure portion can be obtained. The developer can be propylene glycol monomethyl ether acetate (PGMEA), ethylacetate, or diacetone alcohol, but is not limited thereto.

The structure can be an insulating layer having a predetermined pattern. Specifically, the structure can be a chamber layer and/or nozzle layer of inkjet print head. An inkjet print head according to an embodiment of the present general inventive concept can include a substrate having ink feed hole passing therethrough for ink supply, a chamber layer including a plurality of ink chambers which are filled with the ink supplied through the ink feed hole is filled supplied, and a nozzle layer having a plurality of nozzles through which the ink is ejected. Specifically, a thermal-operation type inkjet head according to an embodiment of the present general inventive concept can be understood with reference to FIG. 1.

Referring to FIG. 1, inkjet print head includes a substrate 10, a chamber layer 20 deposited on the substrate 10, and a nozzle layer 30 deposited on the chamber layer 20. The chamber layer 20 includes a plurality of ink chambers 22 which are filled with ink to be ejected. The nozzle layer 30 includes a nozzle 32 through which ink is ejected. The chamber layer 20 and the nozzle layer 30 can be formed using a photoresist composition including a mixture of an oxetane-containing compound and an oxirane-containing compound according to an embodiment of the present general inventive concept. Therefore, the chamber layer 20 and the nozzle layer 30 can include a polymerization product of the mixture of an oxetane-containing compound and an oxirane-containing compound according to an embodiment of the present general inventive concept.

The substrate 10 includes an ink feed hole 11 passing therethrough, which supplies ink to the ink chambers 22. The chamber layer 20 includes a plurality of restrictors 24 to connect the ink chambers 22 to the ink feed hole 11. The substrate 10 can be a silicon substrate. An insulating layer 12 is formed on the substrate 10 to insulate a plurality of heaters 14 from the substrate 10. The heaters 14 which heat ink contained in the ink chambers 22 to generate bubbles are formed on the insulating layer 12. A plurality of electrodes 16 are formed on the heaters 14 to provide an electric current to the heaters 14. A passivation layer A 18 is formed on the heaters 14 and the electrodes 16 to protect the heaters 14 and the electrodes 16. An anti-cavitation layer 19 is formed on the passivation layer 18 to protect the heaters 14 from a cavitation force generated when bubbles burst.

The chamber layer 20 and the nozzle layer 30 are formed using a photoresist composition including a mixture of an oxetane-containing compound and an oxirane-containing compound according to the present general inventive concept so that the chamber layer 20 and the nozzle layer 30 includes a polymerization product of the mixture of an oxetane-containing compound and an oxirane-containing compound according to the present general inventive concept. Therefore, the chamber layer 20 and the nozzle layer 30 have an excellent heat tolerance, and even when exposed to high temperature by the heaters 14, the chamber layer 20 and the nozzle layer 30 may not be deformed and provide excellent durability.

The structure can also be a sacrificial layer which exposes a predetermined metal layer in a process of manufacturing a MEMS switch. The MEMS switch is described in detail in Korean Patent Application Pub. 2006-0068915, and all of the references cited therein are incorporated by reference in their entireties.

The present general inventive concept will be described in further detail with reference to the following examples. These examples are for illustrative purposes only and are not intended to limit the scope of the present general inventive concept.

SYNTHESIS EXAMPLE 1

Synthesis of toluene-4-sulfuric acid 3-methyl-oxetane-3-yl methyl ester(toluene-4-sulfuric acid-3-methyl-oxetan-3-yl methyl ester)

Toluene-4-sulfuric acid 3-methyl-oxetane-3-yl methyl ester was synthesized according to Reaction Scheme 1.

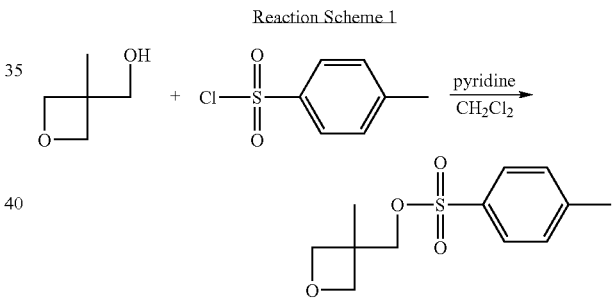

57.20 g (0.3 mmol) of p-toluene sulfonyl chloride was added to 250 ml of pyridine in a nitrogen atmosphere in a reaction vessel, and then the reaction vessel was cooled with an ice water. When the temperature was dropped, 20 ml (MOMT: 20.68 g, 0.20 mmol) of 3-methyl-3-oxetane-methanol was slowly added thereto and reacted together for 2 hours. When the reaction was complete, the reaction solution was slowly added to 2λ of a solution of ice and water in a volume ratio of 1:1 and stirred for 30 minutes. The resultant precipitate was filtered, washed with cold water, and then dried in a vacuum. As a result, a toluene-4-sulfuric acid 3-methyl-oxetane-3-yl methyl ester (yield 90%) was obtained.

$^1$H NMR (CDCl$_3$, 300 MHz): δ 7.78 (d, 2H), 7.34 (d, 2H), 4.31 (m, 4H), 4.04 (s, 2H), 2.43 (s, 3H), 1.27 (s, 3H)

SYNTHESIS EXAMPLE 2

Synthesis of Oxetane-Containing Compound (I)

Oxetane-containing compound was synthesized according to Reaction Scheme 2.

Reaction Scheme 2

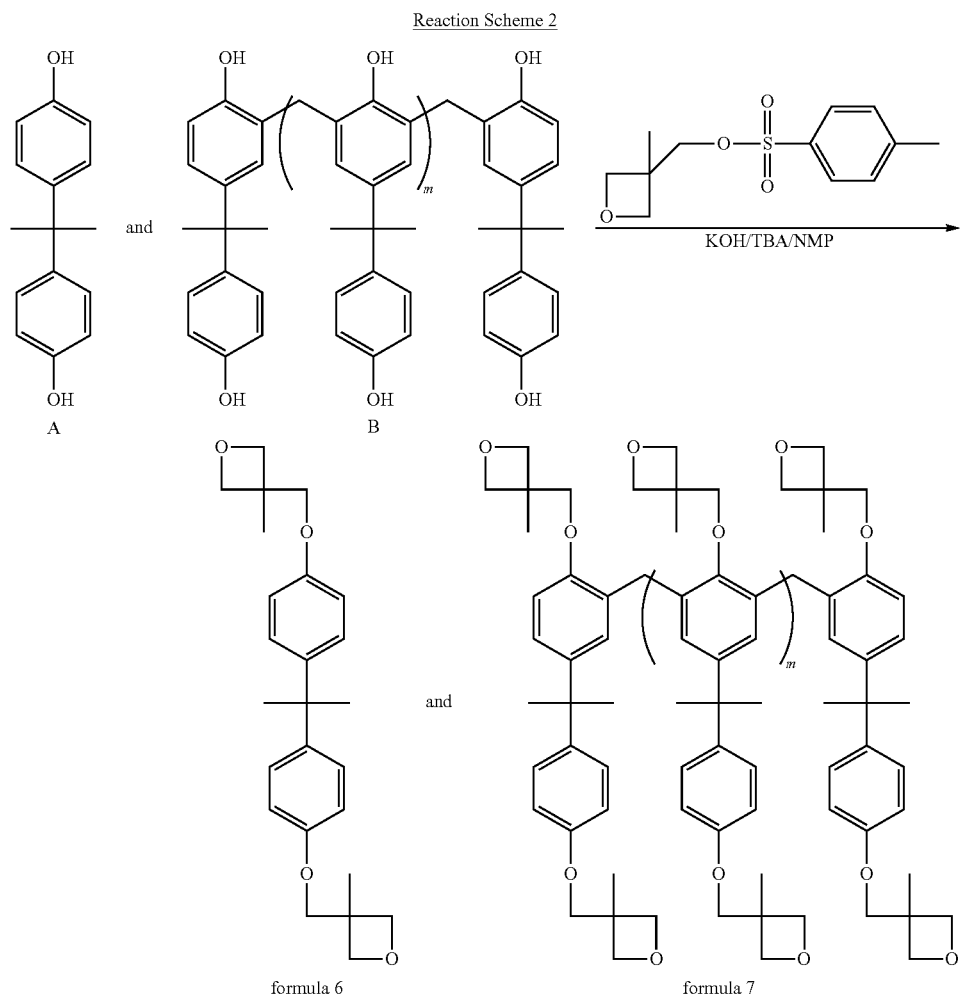

formula 6            formula 7

5 g (5.0 mol) of a novolac resin of Reaction Scheme 2 (a mixture of Compounds A and B in Reaction Scheme 2 where m is 0, 1, or 2) and 5.6 g (0.1 mol) of KOH were dissolved by adding 20 ml of N-methyl-2-pyrrolidone (NMP) thereto at room temperature. Then, 15.38 g (0.06 mol) of toluene-4-sulfuric acid 3-methyl-oxetane-3-yl methyl ester obtained from Synthesis Example 1 and 0.6 g (0.002 mol) of tetrabutylammonium bromide were added thereto. The reaction product was reacted at 70° for 48 hours, and then water was added to the reaction solution. The resultant precipitate was filtered under a reduced pressure and then washed several times with KOH solution, and water. The washed product was dried in a vacuum to obtain a mixture of a compound represented by Formula 6 and a compound represented by Formula 7 where m is 0, 1, or 2. The amount of the obtained mixture was 5.3 g (yield 65%).

$^1$H NMR (CDCl$_3$, 300 MHz): δ 7.15-6.69 (m, 7H), 4.61-3.87 (m, 14H), 1.63-1.17 (m, 12H).

PREPARATION EXAMPLE 1

Synthesis of Oxirane-Containing Compound

A commercially available epoxy resin (SU-8, EPON SU-8 FROM HEXION SPECALITY CO.) was used as an oxirane-containing compound. The oxirane-containing compound is a mixture of a compound represented by Formula 12 and a compound represented by Formula 13.

EXAMPLE 1

Preparation of Photoresist Composition Including the Oxetane-Containing Compound (a Mixture of a Compound Represented by Formula 10 and a Compound Represented by Formula 11) Obtained from Synthesis Example 2, and the Oxirane-Containing Compound (a Mixture of a Compound Represented by Formula 12 and a Compound Represented by Formula 13) obtained from Preparation Example 1 and Pattern Formation Using the Photoresist Composition 10 g of oxetane-containing compound prepared according to Synthesis Example 2, 10 g of oxirane-containing compound prepared according to Preparation Example 1, 1.0 g of triphenyl sulfonium hexafluoroantimonate (product name is SP-172, the manufacturer is Japanese Asahi Denka) that acts as a photoinitiator, and 12 g of gamma-butyrolactone (GBL) that acts as a solvent were mixed together and stirred for one day. The resultant mixture was filtered using a 5 μm filter to obtain a transparent solution.

The transparent solution was spin coated on a silicon substrate at a rotation speed of 3000 rpm for 40 sec and heated at 95° for 7 minutes to obtain a homogenous layer. The layer was exposed to light of 130 mJ/cm$^2$ I-line using a Hg/Xe lamp exposure apparatus and heated at 95° for 3 minutes.

Figure 2A:
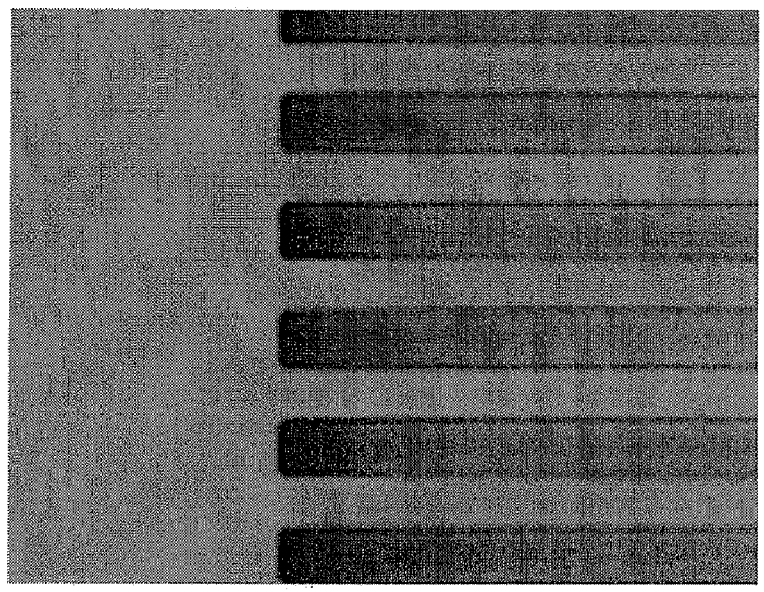
FIG. 2A is an optical microscopic image of a stripe-type pattern of a photoresist composition prepared according to Example 1.
Figure 3A:
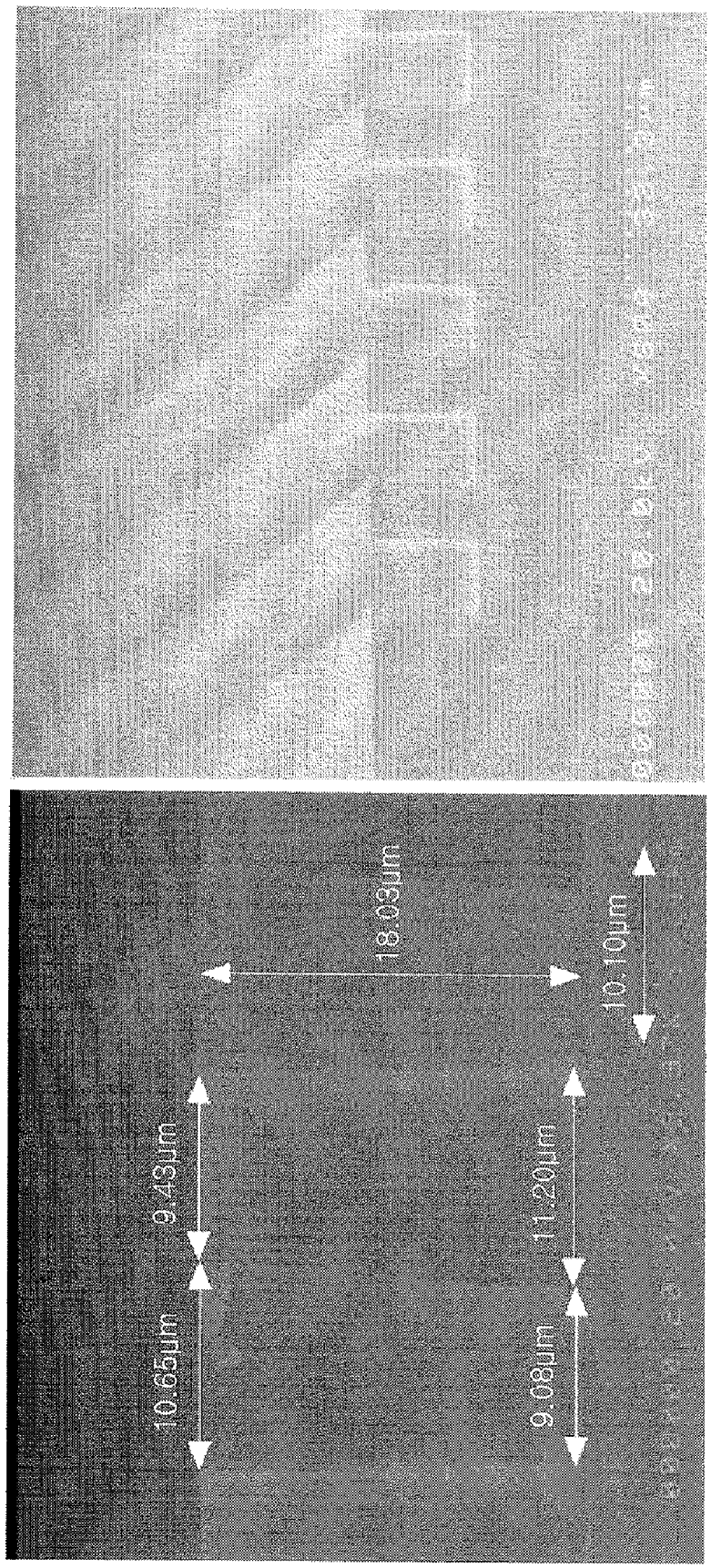
FIG. 3A is an electron microscope image of a stripe-type pattern of a photoresist composition prepared according to Example 1.

Then, a developing process was performed for 1 minute using propylene glycol monomethyl ether acetate (PGMEA) that acts as a developer and then washed with isopropyl alcohol (IPA) for 10 seconds to obtain a layer having a stripe-type pattern which is illustrated in FIGS. 2A, and 3A. The layer having a stripe-type pattern can have excellent heat tolerance, excellent durability, and excellent adhesiveness.

EXAMPLE 2

Preparation of Photoresist Composition Including the Oxetane-Containing Compound (a Mixture of a Compound Represented by Formula 10 and a Compound Represented by Formula 11) Obtained from Synthesis Example 2, and the Oxirane-Containing Compound (a Mixture of a Compound Represented by Formula 12 and a Compound Represented by Formula 13) obtained from Preparation Example 1, and Structure Formation Using the Photoresist Composition This experiment was performed in the same manner as in Example 1, except that an inkjet print head structure was fabricated instead of the stripe-type pattern.

Figure 2B:
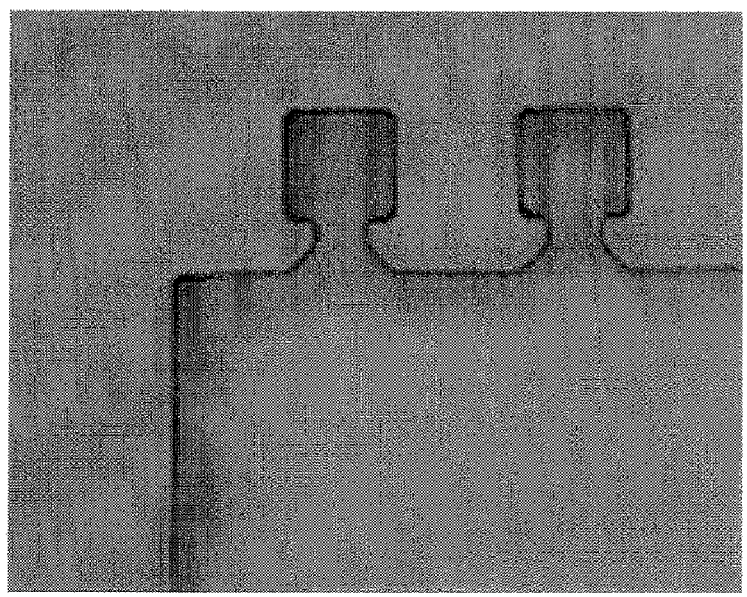
FIG. 2B is an optical microscopic image of inkjet print head formed using a photoresist composition prepared according to Example 2.

FIG. 2B illustrates an optical microscopic image of the inkjet print head structure.

COMPARATIVE EXAMPLE 1

Preparation of Photoresist Composition Including the Oxirane-Containing Compound (a Mixture of a Compound Represented by Formula 12 and a Compound Represented by Formula 13) Obtained from Preparation Example 1, and Pattern Formation Using the Photoresist Composition This experiment was performed in the same manner as in Example 1, except that 10 g of oxirane-containing compound prepared according to Preparation Example 1 was used alone and the oxetane-containing compound prepared according to Synthesis Example 2 was not used.

Figure 2C:
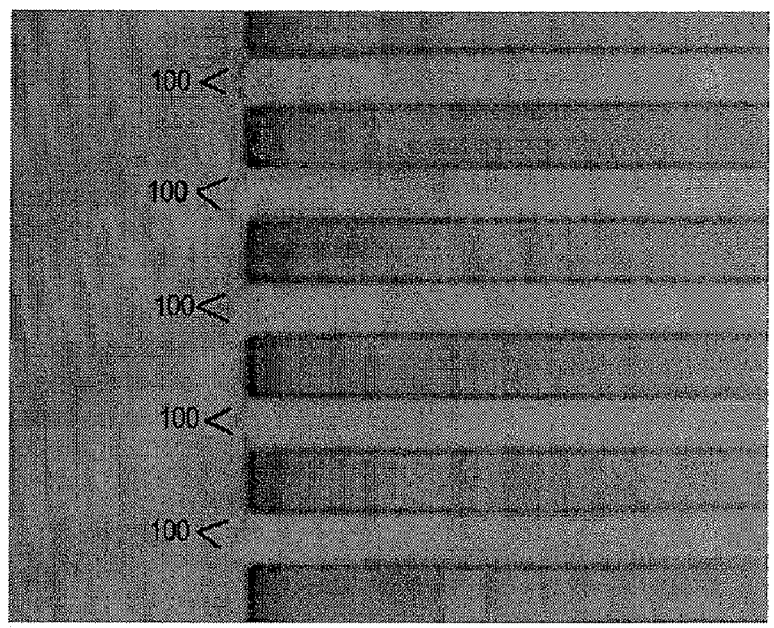
FIG. 2C is an optical microscopic image of a stripe-type pattern of a photoresist composition prepared according to Comparative Example 1.
Figure 3B:
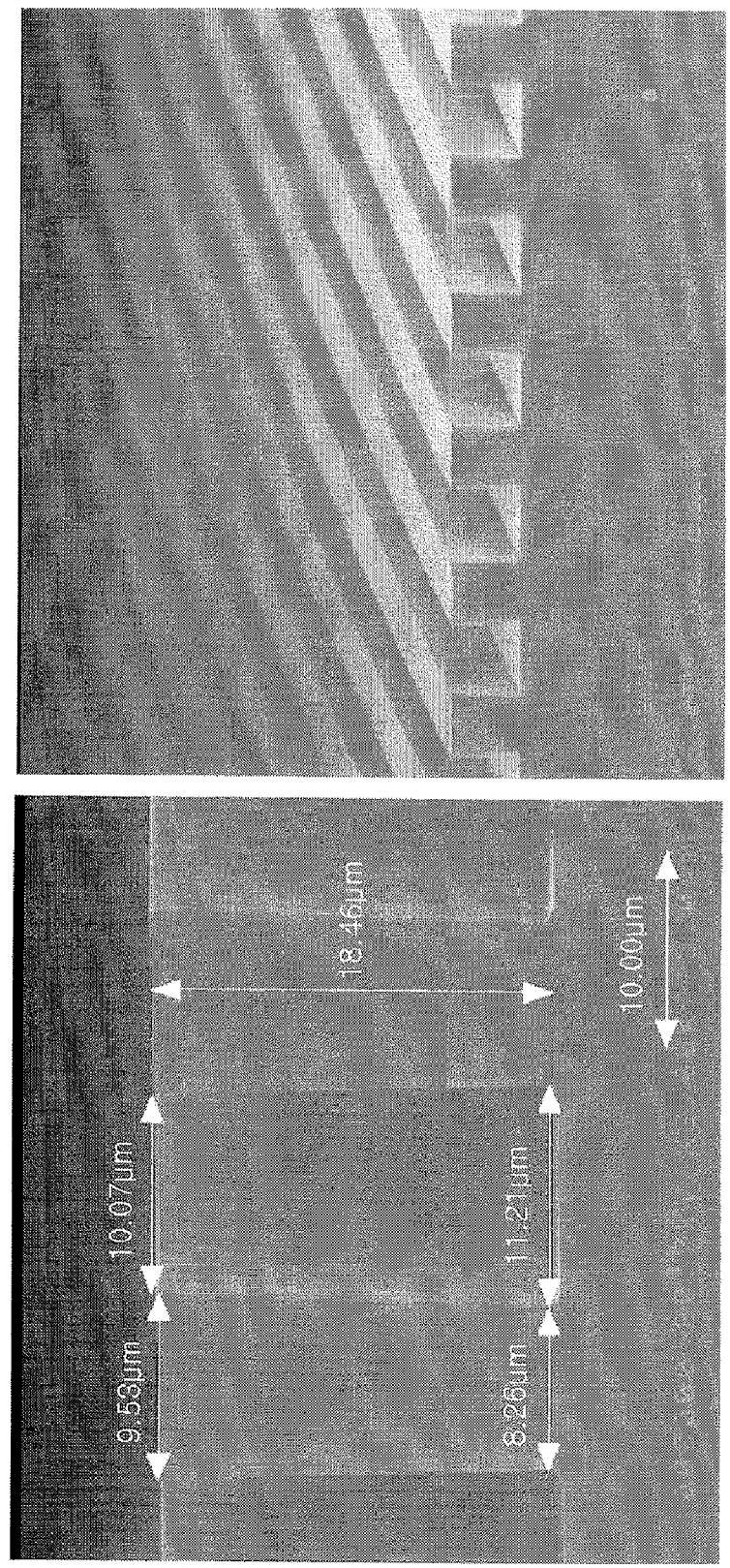
FIG. 3B is an electron microscope image of a stripe-type pattern of a photoresist composition prepared according to Comparative Example 1.

The stripe-type pattern prepared according to Comparative Example 1 is illustrated in FIGS. 2C and 3B

COMPARATIVE EXAMPLE 2

Preparation of Photoresist Composition Including the Oxirane-Containing Compound (a Mixture of a Compound Represented by Formula 12 and a Compound Represented by Formula 13) Obtained from Preparation Example 1, and Pattern Formulation Using the Photoresist Composition This experiment was performed in the same manner as in Comparative Example 1, except that an inkjet print head structure was fabricated instead of the stripe-type pattern.

Figure 2D:
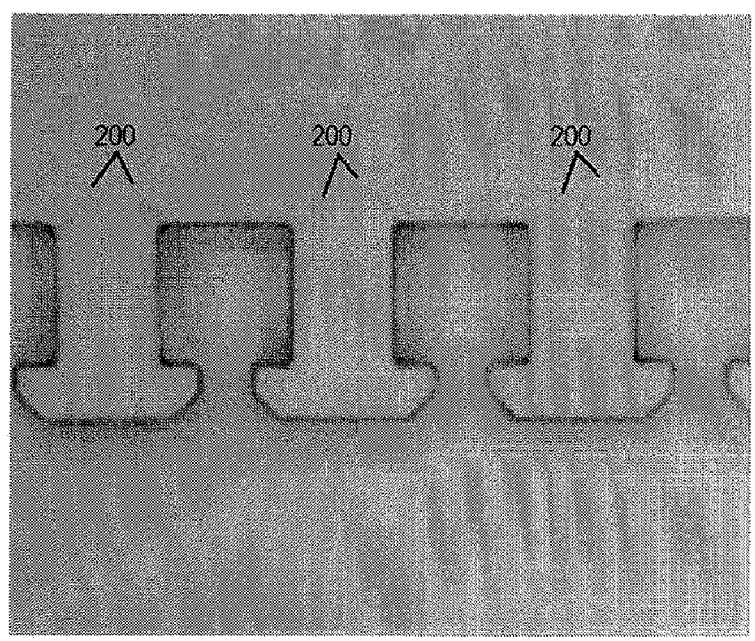
FIG. 2D is an optical microscopic image of inkjet print head formed using a photoresist composition prepared according to Comparative Example 2.

An optical microscopic image of the inkjet print head structure is illustrated in FIG. 2D.

ASSESSMENT EXAMPLE 1A

Identification of Cracks in Comparative Example 1 (Optical Microscope)

Using an optical microscope, it was identified whether cracks are formed in the inkjet print head structures prepared according to Example 1 and Comparative Example 1. Optical microscopic images are illustrated in FIG. 2A (Example 1) and FIG. 2C (Comparative Example 1).

Referring to the optical microscopic images, the structure obtained using the photoresist composition prepared according to Example 1 did not have any cracks (see FIG. 2A), but the structure obtained using the photoresist composition prepared according to Comparative Example 1 has cracks 100 at its corners (see FIG. 2C), which are generated by an inner stress.

ASSESSMENT EXAMPLE 1B

Identification of Cracks in Comparative Example 2 (Optical Microscope)

Using an optical microscope, it was identified whether cracks are formed in the inkjet print head structures prepared according to Example 2 and Comparative Example 2. Optical microscopic images are illustrated in FIG. 2B (Example 2) and FIG. 2D (Comparative Example 2).

Referring to the optical microscopic images, the structure obtained using the photoresist composition prepared according to Example 2 did not have any cracks (see FIG. 2B), but the structure obtained using the photoresist composition prepared according to Comparative Example 2 has cracks 200 at its corners (see FIG. 2D), which are generated by an inner stress.

Therefore, it can be seen that a photoresist composition according to the present general inventive concept does not cause inner stress-derived cracks when it is formed in a structure or film, unlike a conventional photoresist composition.

ASSESSMENT EXAMPLE 2

Identification of Cracks (Electron Microscope)

Electron microscopic images of the patterns formed according to Example 1 and Comparative Example 1 are illustrated in FIGS. 3A and 3B. Those patterns provide similar resolutions.

Such a result illustrates that a photoresist composition according to an embodiment of the present general inventive concept provides a property, such as resolution, similar to a photoresist composition prepared according to Comparative Example 1 when developed.

A photoresist composition according to an embodiment of the present general inventive concept resists formation of cracks therein when it is polymerized, and a polymerization product of the photoresist composition has excellent heat tolerance, excellent chemical resistance, excellent adhesiveness, and excellent durability. Therefore, the photoresist composition is suitable to form a structure having various patterns.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A photoresist composition, comprising:
an oxetane-containing compound represented by Formula 1 and an oxetane-containing compound represented by Formula 2;
an oxirane-containing compound represented by Formula 3 and an oxirane-containing compound represented by Formula 4;
a photoinitiator; and
a solvent:

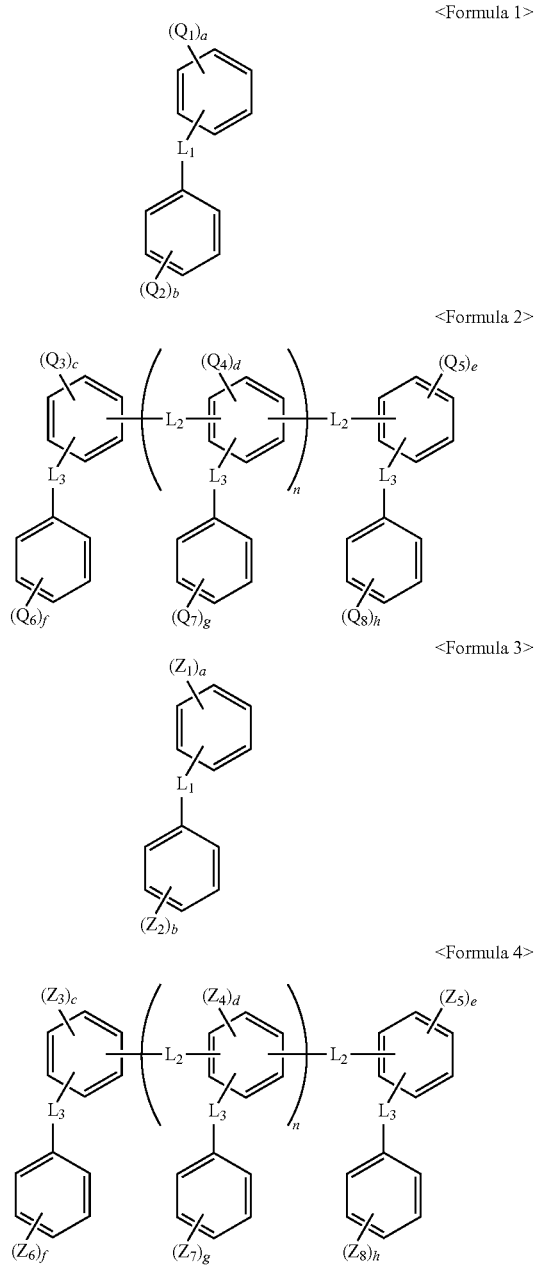

where $Q_1$, $Q_2$, $Q_3$, $Q_4$, $Q_5$, $Q_6$, $Q_7$, and $Q_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_4$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Q_1$, $Q_2$, $Q_3$, $Q_4$, $Q_5$, $Q_6$, $Q_7$, and $Q_8$ can be different from or identical to each other, and at least one hydrogen atom of a plurality of $Q_1$, and $Q_2$ and at least one hydrogen atom of a plurality of $Q_3$, $Q_4$, $Q_5$, $Q_6$, $Q_7$, and $Q_8$ are substituted with an oxetane group;

$Z_1$, $Z_2$, $Z_3$, $Z_4$, $Z_5$, $Z_6$, $Z_7$, and $Z_8$ are each independently hydrogen, a hydroxyl group, a carboxyl group, a substituted or unsubstituted $C_1$-$C_{30}$ alkyl group; a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Z_1$, $Z_2$, $Z_3$, $Z_4$, $Z_5$, $Z_6$, $Z_7$, and $Z_8$ can be different from or identical to each other, and at least one hydrogen atom of a plurality of $Z_1$, and $Z_2$ and at least one hydrogen atom of a plurality of $Z_3$, $Z_4$, $Z_5$, $Z_6$, $Z_7$, and $Z_8$ are substituted with an oxirane group, wherein:

a plurality of a, b, c, d, e, f, g, and h represent a number of $Z_1$, $Z_2$, $Z_3$, $Z_4$, $Z_5$, $Z_6$, $Z_7$, and $Z_8$, respectively,
a is 1, 2, 3, or 4,
b is 1, 2, 3, 4, or 5,
c and e are each independently 1, 2, or 3,
d is 1 or 2,
f, g, and h are each independently 1, 2, 3, or 4,
$L_1$, $L_2$, and $L_3$ are each independently, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_6$-$C_{30}$ arylene group, a substituted or unsubstituted $C_3$-$C_{30}$ hetero arylene group, or a substituted or unsubstituted ether bond-containing divalent group,
n is 0, or an integer ranging from 1 to 10, and
a, b, c, d, e, f, g, h, $L_1$, $L_2$, $L_3$, and n can be different from or identical to each other.

2. The photoresist composition of claim 1, wherein the oxetane group is represented by Formula 5:

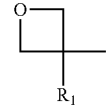

where $R_1$ is selected from the group consisting of hydrogen, halogen atom, hydroxy group, nitro group, cyano group, amino group, amidino group, a hydrazine group, a hydrazone group, a carboxyl group, salt of the carboxyl group, a sulfuric acid group, and salt of the sulfuric acid group, phosphoric acid, salt of the phosphoric acid, a carbonyl group, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_6$-$C_{30}$ aryl group, and a substituted or unsubstituted $C_2$-$C_{20}$ hetero aryl group.

3. The photoresist composition of claim 2, wherein $R_1$ is hydrogen or a substituted or unsubstituted $C_1$-$C_{10}$ alkyl group.

4. The photoresist composition of claim 1, wherein $Q_1$, $Q_2$, $Q_3$, $Q_4$, $Q_5$, $Q_6$, $Q_7$, and $Q_8$ are each independently hydrogen, a hydroxyl group, a $C_1$-$C_{30}$ alkoxy group substituted with an oxetane group represented by Formula 5 or a carbonyl group, a $C_1$-$C_{30}$ alkyl group substituted with an oxetane group represented by Formula 5 or a carbonyl group, or an ether bond-containing monovalent group substituted with an oxetane group represented by Formula 5 or a carbonyl group:

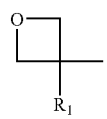

<Formula 5> where $R_1$ is selected from the group consisting of hydrogen, halogen atom, hydroxy group, nitro group, cyano group, amino group, amidino group, a hydrazine group, a hydrazone group, a carboxyl group, salt of the carboxyl group, a sulfuric acid group, and salt of the sulfuric acid group, phosphoric acid, salt of the phosphoric acid, a carbonyl group, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_6$-$C_{30}$ aryl group, and a substituted or unsubstituted $C_2$-$C_{20}$ hetero aryl group.

5. The photoresist composition of claim 1, wherein $Q_1$, $Q_2$, $Q_3$, $Q_4$, $Q_5$, $Q_6$, $Q_7$, and $Q_8$ are each independently hydrogen, or a group selected from the groups represented by Formula 6:

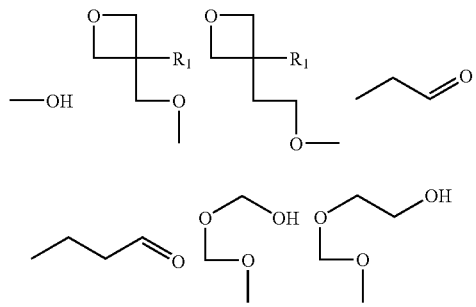

<Formula 6> where $R_1$ is selected from the group consisting of hydrogen, halogen atom, hydroxy group, nitro group, cyano group, amino group, amidino group, a hydrazine group, a hydrazone group, a carboxyl group, salt of the carboxyl group, a sulfuric acid group, and salt of the sulfuric acid group, phosphoric acid, salt of the phosphoric acid, a carbonyl group, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_6$-$C_{30}$ aryl group, and a substituted or unsubstituted $C_2$-$C_{20}$ hetero aryl group.

6. The photoresist composition of claim 1, wherein the oxirane group is represented by Formula 7:

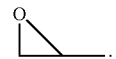

<Formula 7>

7. The photoresist composition of claim 1, wherein $Z_1$, $Z_2$, $Z_3$, $Z_4$, $Z_5$, $Z_6$, $Z_7$, and $Z_8$ are each independently hydrogen, a hydroxyl group, a $C_1$-$C_{30}$ alkoxy group substituted with an oxirane group represented by Formula 7 or a carbonyl group, a $C_1$-$C_{30}$ alkyl group substituted with an oxirane group represented by Formula 7 or a carbonyl group, or an ether bond-containing monovalent group substituted with an oxirane group represented by Formula 7 or a carbonyl group:

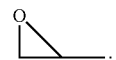

<Formula 7>

8. The photoresist composition of claim 1, wherein $Z_1$, $Z_2$, $Z_3$, $Z_4$, $Z_5$, $Z_6$, $Z_7$, and $Z_8$ are each independently hydrogen, or a group selected from the groups represented by Formula 8:

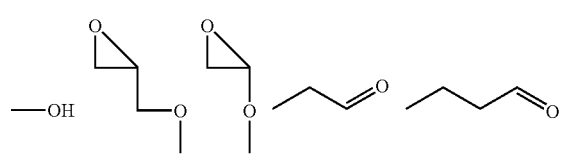

<Formula 8>

9. The photoresist composition of claim 1, wherein $L_1$, $L_2$, and $L_3$ are each independently at least one group selected from the groups represented by Formula 9:

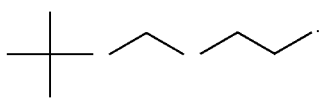

<Formula 9>

10. The photoresist composition of claim 1, wherein the photoresist composition comprises an oxetane-containing compound represented by at least one of Formula 10 and Formula 11:

<Formula 10>

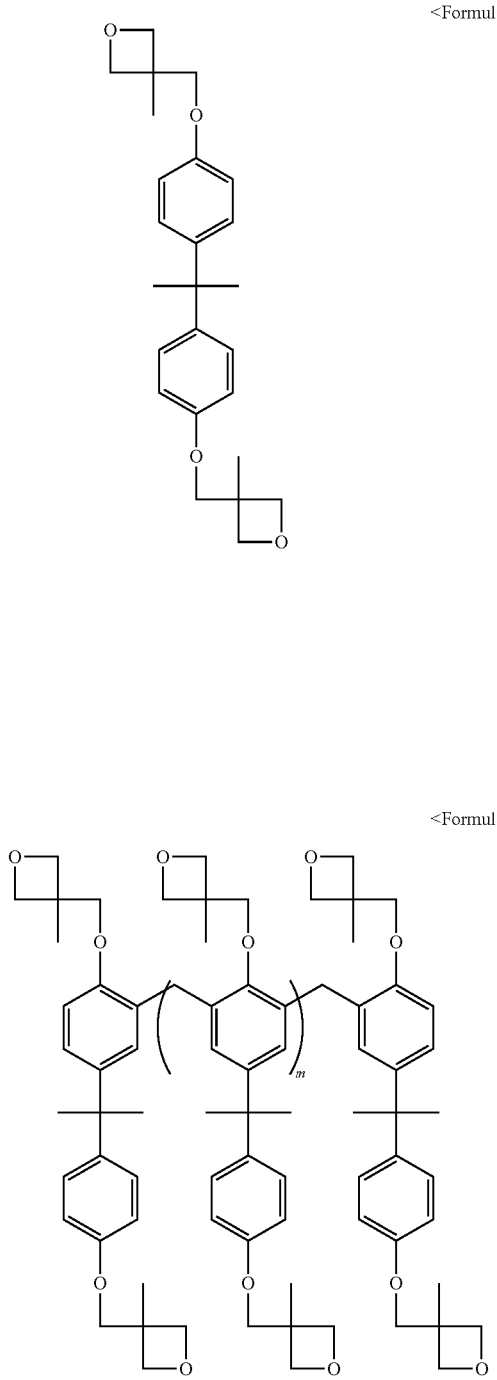

where m is 0, 1, or 2.

11. The photoresist composition of claim 1, wherein the photoresist composition comprises an oxirane-containing compound represented by at least one of Formula 12 and 13:

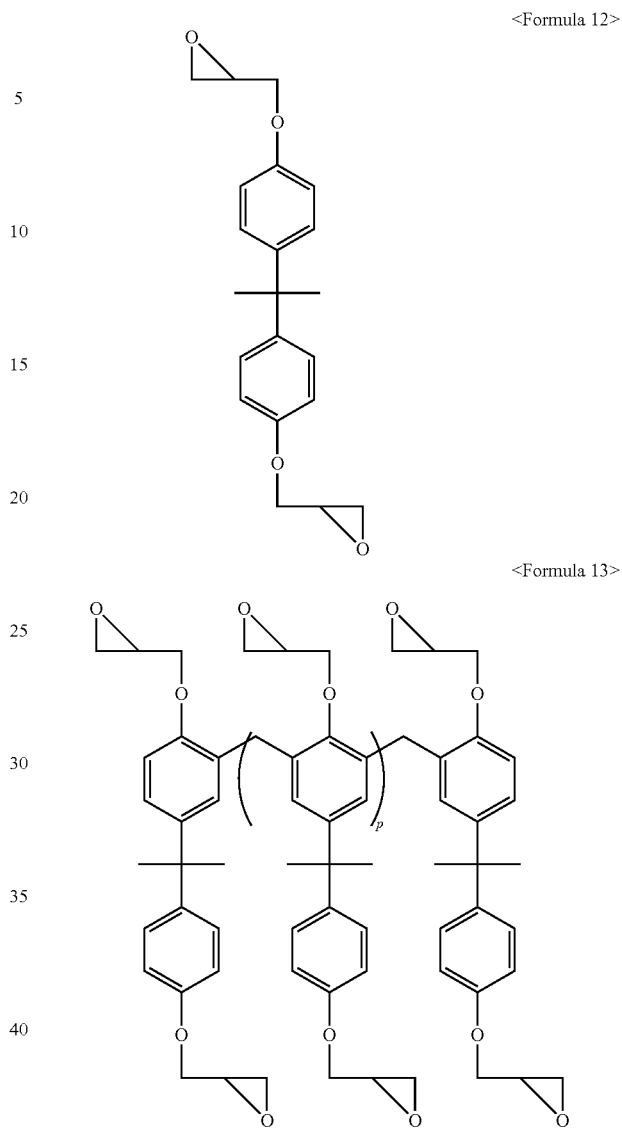

where p is 0, 1, or 2.

12. The photoresist composition of claim 1, wherein the weight ratio of the oxirane-containing compound to the oxetane-containing compound is in a range from 1:0.1 to 1:10.

13. The photoresist composition of claim 1, wherein the photoinitiator comprises at least one salt selected from the group consisting of an onium salt of Group 15 element, an onium salt of Group 16 element, and an aromatic halonium salt.

14. The photoresist composition of claim 1, wherein the amount of the photoinitiator is in the range from 5 parts by weight to 20 parts by weight based on 200 parts by weight of a mixture of the oxetane-containing compound and the oxirane-containing compound.

15. The photoresist composition of claim 1, wherein the solvent comprises at least one element selected from the group consisting of γ-butyrolactone, cyclopentanone, $C_1$-$C_6$ acetate, tetrahydrofuran, and xylene.

16. The photoresist composition of claim 1, wherein the amount of the solvent is in a range from 30 parts by weight to 100 parts by weight based on 200 parts by weight of a mixture of the oxetane-containing compound and the oxirane-containing compound.

17. The photoresist composition of claim 1, wherein the photoresist composition further comprises at least one additive selected from the group consisting of a slime coupling agent, a dye, surfactant, a filler, and a viscosity reformer.

18. A method of forming a pattern, the method comprising:
coating a photoresist composition on a substrate, the photoresist composition comprising:
an oxetane-containing compound represented by Formula 1 or Formula 2,
an oxirane-containing compound represented by Formula 4;
a photoinitiator; and
a solvent:

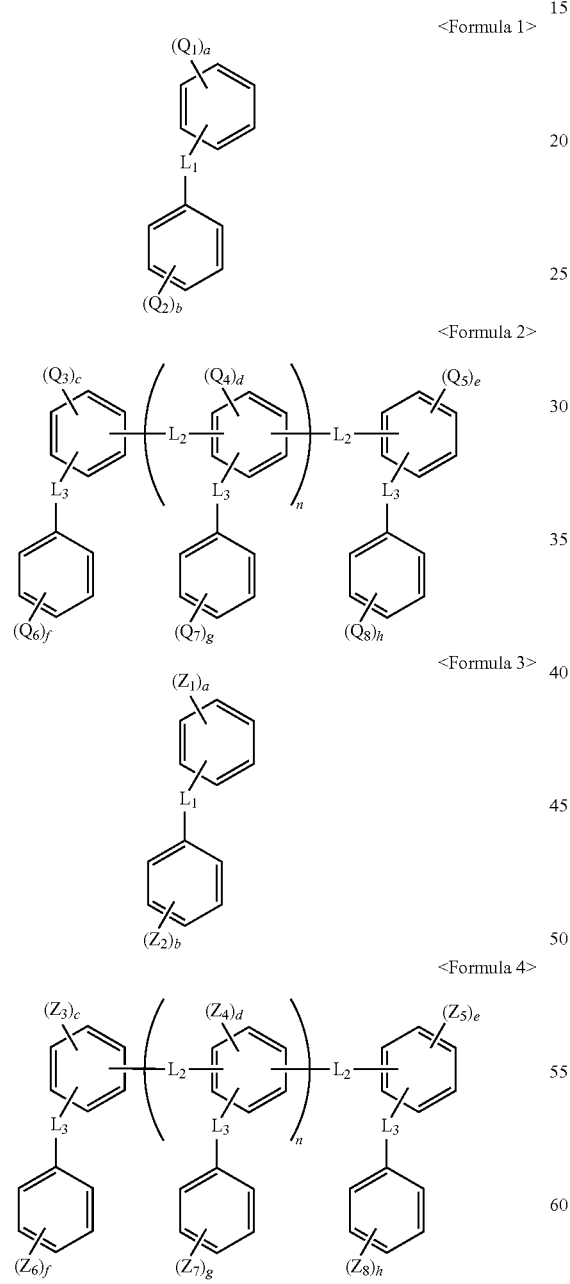

where $Q_1$, $Q_2$, $Q_3$, $Q_4$, $Q_5$, $Q_6$, $Q_7$, and $Q_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_4$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Q_1$, $Q_2$, $Q_3$, $Q_4$, $Q_5$, $Q_6$, $Q_7$, and $Q_8$ can be different from or identical to each other, and at least one hydrogen atom of a plurality of $Q_1$, and $Q_2$ and at least one hydrogen atom of a plurality of $Q_3$, $Q_4$, $Q_5$, $Q_6$, $Q_7$, and $Q_8$ are substituted with an oxetane group;

$Z_3$, $Z_4$, $Z_5$, $Z_6$, $Z_7$, and $Z_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Z_3$, $Z_4$, $Z_5$, $Z_6$, $Z_7$, and $Z_8$ can be different from or identical to each other, and at least one hydrogen atom of a plurality of $Z_3$, $Z_4$, $Z_5$, $Z_6$, $Z_7$, and $Z_8$ are substituted with an oxirane group, wherein:

a plurality of a, b, c, d, e, f, g, and h represent a number of $Z_3$, $Z_4$, $Z_5$, $Z_6$, $Z_7$, and $Z_8$, respectively,
a is 1, 2, 3, or 4,
b is 1, 2, 3, 4, or 5,
c and e are each independently 1, 2, or 3,
d is 1 or 2,
f, g, and h are each independently 1, 2, 3, or 4,
$L_1$, $L_2$, and $L_3$ are each independently, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_6$-$C_{30}$ arylene group, a substituted or unsubstituted $C_3$-$C_{30}$ hetero arylene group, or a substituted or unsubstituted ether bond-containing divalent group,
n is 0, or an integer ranging from 1 to 10, and
a, b, c, d, e, f, g, h, $L_1$, $L_2$, $L_3$, and n can be different from or identical to each other; and exposing the coated photoresist composition according to the pattern and developing the exposed product to obtain a structure having the pattern.

19. The method of claim 18, wherein the structure is a chamber layer of an inkjet print head.

20. The method of claim 18, wherein the structure is a nozzle layer of an inkjet print head.

21. The method of claim 18, wherein the structure is a sacrificial layer which is required to fabricate a micro electro mechanical system (MEMS) switch.

22. An inkjet print head, comprising:
a substrate having an ink feed hole formed therethrough to supply ink;
a chamber layer comprising a plurality of ink chambers which are filled with ink provided through the ink feed hole; and a nozzle layer comprising a plurality of nozzles through which the ink is ejected, wherein
at least one of the chamber layer and the nozzle layer comprises a polymerization product of a mixture of the oxetane-containing compound and the oxirane-containing compound included in a photoresist composition comprising:
an oxetane-containing compound represented by Formula 1 or Formula 2,
an oxirane-containing compound represented by Formula 3 or Formula 4;
a photoinitiator; and
a solvent:

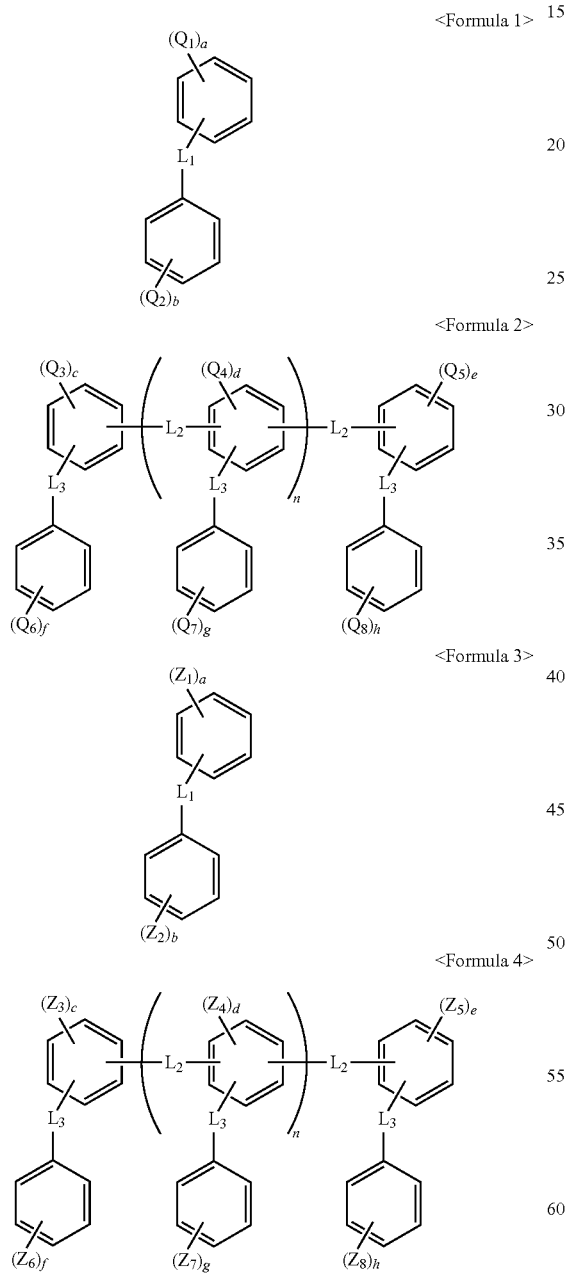

where $Q_1$, $Q_2$, $Q_3$, $Q_4$, $Q_5$, $Q_6$, $Q_7$, and $Q_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Q_1$, $Q_2$, $Q_3$, $Q_4$, $Q_5$, $Q_6$, $Q_7$ and $Q_8$ can be different from or identical to each other, and at least one hydrogen atom of a plurality of $Q_1$, and $Q_2$ and at least one hydrogen atom of a plurality of $Q_3$, $Q_4$, $Q_5$, $Q_6$, $Q_7$, and $Q_8$ are substituted with an oxetane group;

$Z_1$, $Z_2$, $Z_3$, $Z_4$, $Z_5$, $Z_6$, $Z_7$, and $Z_8$ are each independently hydrogen, a hydroxyl group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ aliphatic hydrocarbon ring, a substituted or unsubstituted $C_6$-$C_{30}$ aryl group, a substituted or unsubstituted $C_3$-$C_{30}$ hetero aryl group, a substituted or unsubstituted $C_6$-$C_{30}$ aryloxy group, a substituted or unsubstituted $C_6$-$C_{30}$ acyl group, or a substituted or unsubstituted ether bond-containing monovalent group, in which a plurality of $Z_1$, $Z_2$, $Z_3$, $Z_4$, $Z_5$, $Z_6$, $Z_7$, and $Z_8$ can be different from or identical to each other, and at least one hydrogen atom of a plurality of $Z_1$, and $Z_2$ and at least one hydrogen atom of a plurality of $Z_3$, $Z_4$, $Z_5$, $Z_6$, $Z_7$, and $Z_8$ are substituted with an oxirane group, wherein:

a plurality of a, b, c, d, e, f, g, and h represent a number of $Z_1$, $Z_2$, $Z_3$, $Z_4$, $Z_5$, $Z_6$, $Z_7$, and $Z_8$, respectively, a is 1, 2, 3, or 4, b is 1, 2, 3, 4, or 5, c and e are each independently 1, 2, or 3, d is 1 or 2, f, g, and h are each independently 1, 2, 3, or 4, $L_1$, $L_2$, and $L_3$ are each independently, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_6$-$C_{30}$ arylene group, a substituted or unsubstituted $C_3$-$C_{30}$ hetero arylene group, or a substituted or unsubstituted ether bond-containing divalent group, n is 0, or an integer ranging from 1 to 10, and a, b, c, d, e, f, g, h, $L_1$, $L_2$, $L_3$, and n can be different from or identical to each other.

23. The inkjet print head of claim 22, further comprising:
a plurality of heaters to heat ink contained in the ink chambers to generate bubbles; and
electrodes which provide a current to the heaters.

* * * * *